(12) United States Patent
Willis et al.

(10) Patent No.: US 12,316,335 B2
(45) Date of Patent: May 27, 2025

(54) AUTOMATIC CALIBRATION OF A RING PHASE LOCKED LOOP

(71) Applicant: RAYTHEON COMPANY, Waltham, MA (US)

(72) Inventors: Magathi Willis, Broomfield, CO (US); Micky R. Harris, Lompoc, CA (US)

(73) Assignee: Raytheon Company, Arlington, VA (US)

( * ) Notice: Subject to any disclaimer, the term of this patent is extended or adjusted under 35 U.S.C. 154(b) by 12 days.

(21) Appl. No.: 18/223,365

(22) Filed: Jul. 18, 2023

(65) Prior Publication Data
US 2025/0030428 A1 Jan. 23, 2025

(51) Int. Cl.
*H03L 7/085* (2006.01)
*H03L 7/099* (2006.01)
(52) U.S. Cl.
CPC ............ *H03L 7/0991* (2013.01); *H03L 7/085* (2013.01)

(58) Field of Classification Search
CPC .............................. H03L 7/0991; H03L 7/085
See application file for complete search history.

(56) References Cited

U.S. PATENT DOCUMENTS

2010/0213984 A1\* 8/2010 Shin ..................... H03L 7/104
327/156

\* cited by examiner

*Primary Examiner* — Rahel Guarino

(57) ABSTRACT

A system for automatically calibrating a phase locked loop (PLL), the system comprising: a node a voltage controlled oscillator (VCO) coupled to the node and configured to provide an output signal to the node; at least one digital-to-analog converter (DAC) coupled to the VCO and configured to provide a voltage to the VCO; and at least one controller configured to: determine an output frequency of the output signal; responsive to determining the output frequency, compare the output frequency to the voltage; responsive to determining the output frequency, compare the output frequency to a target frequency; and control the DAC to modify the voltage based on a comparison of the output frequency to the voltage and a comparison of the output frequency to the target frequency.

20 Claims, 4 Drawing Sheets

AUTOMATIC CALIBRATION OF A RING PHASE LOCKED LOOP

BACKGROUND

1. Field of the Disclosure

At least one example in accordance with the present disclosure relates generally to calibration of phase locked loops.

2. Discussion of Related Art

A phase locked loop (PLL) is a control system that generates an output signal with a phase based on the phase of the input signal to the loop. Phase locked loops are generally closed-loop control systems. Ring PLLs may use a ring oscillator, which is a type of voltage controlled oscillator (VCO).

SUMMARY

According to at least one aspect of the present disclosure, a system for automatically calibrating a phase locked loop (PLL) is presented, the system comprising: a node, a voltage controlled oscillator (VCO) coupled to the node and configured to provide an output signal to the node; at least one digital-to-analog converter (DAC) coupled to the VCO and configured to provide a voltage to the VCO; and at least one controller configured to: determine an output frequency of the output signal; responsive to determining the output frequency, compare the output frequency to the voltage; responsive to determining the output frequency, compare the output frequency to a target frequency; and control the DAC to modify the voltage based on a comparison of the output frequency to the voltage and a comparison of the output frequency to the target frequency.

In some examples, the system further comprises a feedback counter configured to determine the output frequency of the output signal. In some examples, the system further comprises a reference counter configured to increment at a rate based on the target frequency. In some examples, the node is an output node, and the system further comprises an input node configured to receive an input signal. In some examples, the system further comprises a phase-frequency detector coupled to the input node and the output node and configured to detect one or more elements of a set including a phase difference between the input signal and the output signal and a frequency difference between the input signal and the output signal. In some examples, the system further comprises a charge pump coupled to the phase-frequency detector; a filter coupled to the charge pump; and a divide-by-N counter coupled between the phase-frequency detector and the output node. In various examples, the DAC is configured to control the gain and attenuation of the voltage based on the output signal and an input signal. In some examples, the DAC is configured to control an offset voltage applied to the voltage, the offset voltage either increasing or decreasing the voltage, based on the output signal and an input signal.

According to at least one aspect of the present disclosure, a method of automatically calibrating a phase locked loop (PLL) is presented, the method comprising: providing an output signal from an output of a voltage controlled oscillator (VCO); determining a first counter value based on an output frequency of the output signal; determining a second counter value based on a target frequency; determining a clock difference between the first counter value and the second counter value; changing a frequency of the output signal based on the clock difference.

In some examples, changing the frequency of the output signal based on the clock difference includes changing the gain or attenuation of a voltage provided to an input of the VCO to control the output frequency of the output signal. In some examples, changing the frequency of the output signal based on the clock difference includes applying an offset voltage to a voltage provided to an input of the VCO to control the output frequency of the output signal. In some examples, changing a frequency of the output signal based on the clock difference includes changing a voltage provided to an input of the VCO responsive to the clock difference being non-zero. In some examples, the target frequency is a frequency of an input signal provided to an input node of the PLL.

According to at least one aspect of the present disclosure, a non-transitory computer-readable medium containing thereon instructions for calibrating a phase locked loop (PLL) is presented, the instructions instructing at least one processor to: determine a first counter value corresponding to an output frequency of an output signal of a voltage controlled oscillator (VCO); determine a second counter value corresponding to a reference frequency of a reference signal; determine a difference between the first counter value and the second counter value; responsive to determining that the difference is non-zero, alter a voltage provided to an input of the VCO to change the output frequency of the output signal.

In some examples, the instructions further instruct the at least one processor to: determine whether the difference is zero; responsive to determining that the difference is zero, lock the voltage provided to the input of the VCO. In some examples, the instructions further instruct the at least one processor to: responsive to locking the voltage, determine whether the difference exceeds zero by a threshold value; responsive to determining that the difference exceeds zero by a threshold value, unlock the voltage provided to the input of the VCO. In some examples, the instructions further instruct the at least one processor to: control an offset digital-to-analog converter (DAC) to provide an offset voltage to change the voltage provided to the input of the VCO based on the difference. In some examples, the instructions further instruct the at least one processor to: control a gain digital-to-analog converter (DAC) to change the voltage provided to the input of the VCO based on the difference. In some examples, the instructions further instruct the at least one processor to: responsive to determining the difference, determine whether the difference is less than a minimum difference; responsive to determining that the difference is less than a minimum difference and greater than zero, continue calibrating the PLL. In some examples, the instructions further instruct the at least one processor to: responsive to continuing to calibrate the PLL, change the minimum difference to equal the difference.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION

Figure 1:
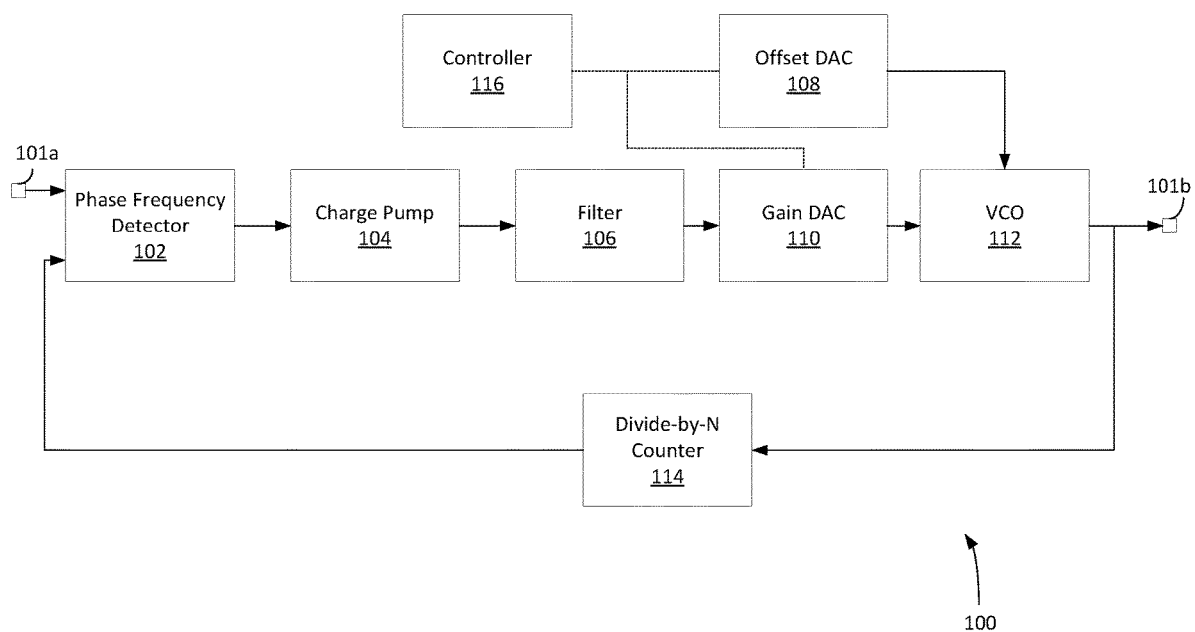
FIG. 1 illustrates a phase locked loop (PLL) according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Phase locked loops (PLLs) may require calibration to determine the frequency of the voltage controlled oscillator (VCO) associated with the PLL. The calibration may account for process, voltage, and temperature variations that may affect the output of the VCO. In some examples, rather than performing manual calibration of the PLL, a lookup table may be included (e.g., in memory) that provides VCO frequencies for given combinations of voltage, temperature, and so forth. Likewise, in some examples, threshold values may be used for the frequencies, and the threshold window may be adjusted until the VCO frequency falls within the threshold window.

In some examples, discussed herein, calibration of the PLL may be achieved using one of two modes. In the first mode, the PLL may be calibrated by measuring the VCO frequency versus an offset voltage by varying the VCO offset digital-to-analog converter (DAC) settings. In the second mode, a voltage DAC sets the loop voltage, and the VCO gain is measured. In some examples, both calibration methods may be used. The calibration methods use the DACs to adjust the voltage of the VCO to get the desired frequency. For example, because a VCO provides an output oscillating at a given frequency, where the frequency depends on an input voltage, by controlling the input voltage a desired frequency can be reached, and then the VCO can be locked at the desired voltage until a deviation in the frequency is reached. Once a deviation is reached, the VCO may be recalibrated using the systems and methods discussed herein. In various examples, the PLL may be in an open loop state during calibration using the calibration modes.

FIG. 1 illustrates a PLL 100 according to an example. The PLL 100 includes an input 101a, an output 101b, a phase frequency detector 102 ("detector 102"), a charge pump 104, a filter 106, an offset DAC 108, a gain DAC 110, a VCO 112, a divide-by-N counter 114 ("divider 114"), and at least one controller 116 ("controller 116").

The input 101a is coupled to the detector 102 at a first connection. The detector 102 is coupled to the input 101a at a first connection and to the charge pump 104 at a second connection. The charge pump 104 is coupled to the detector 102 at a first connection and to the filter 106 at a second connection. The filter 106 is coupled to the charge pump 104 at a first connection and to the gain DAC 110 at a second connection. The gain DAC 110 is coupled to the filter 106 at a first connection and to the VCO 112 at a second connection. The VCO 112 is coupled to the gain DAC 110 at a first connection, the offset DAC 108 at a second connection, and the output 101b and divider 114 at a third connection. The offset DAC 108 is coupled to the VCO 112. The divider 114 is coupled to the VCO 112 and output 101b at a first connection and to the divider 114 at a second connection. The output 101b is coupled to the VCO 112 and the divider 114. The controller 116 may be communicatively coupled to any element of the circuit, including the detector 102, charge pump 104, filter 106, offset DAC 108, gain DAC 110, VCO 112, and/or divider 114. In FIG. 1, controller 116 is communicatively coupled to at least offset DAC 108 and gain DAC 110.

The input 101a is configured to provide an input signal to the PLL 100. In some examples, the input 101a may be configured to provide the input signal to the detector 102. The input signal may be continuous or discrete (i.e., analog or digital). In some examples, the input signal may be generated by a reference clock.

The detector 102 is configured to detect a difference in the phase and frequency of the input signal compared to a feedback signal. The feedback signal is the signal provided by the divider 114 and/or VCO 112 to the detector 102. In some examples, the divider 114 divides the output signal of the VCO 112 and the detector 102 compares the divided signal generated in this way to a reference clock signal (e.g., the input signal provided at the input 101a or a separate input for an independent reference clock signal). The detector 102 generates a phase signal (or phase waveform) that is indicative of the difference in phase and/or frequency of the input signal and feedback signal. The detector 102 provides the phase signal to the charge pump 104.

The charge pump 104 controls a voltage provided to the VCO 112. In some examples, the charge pump 104 may include one or more current sources, and may provide current from the current sources to adjust an input voltage of the VCO 112. In some examples, the charge pump 104 is controlled by the phase signal from the detector 102, such that the charge pump 104 provides currents or voltages to the VCO 112 to bring the output of the VCO 112 closer to the phase and/or frequency of the input signal and/or the desired frequency and/or phase.

The charge pump 104 provides its output to the filter 106. The filter 106 may filter the output of the charge pump 104 and provide the filtered signal to the gain DAC 110. The filter 106 may be a passive or active filter, and may be used to eliminate and/or attenuate unwanted frequency components of the output of the charge pump 104.

The gain DAC 110 may receive the filtered signal from the filter 106. The gain DAC 110 may increase or decrease a characteristic of the filtered signal, such as a voltage and/or current, by applying gain or attenuation to the filtered signal. The gain DAC 110 may convert the filtered signal from digital to analog form, and may provide an analog signal to the VCO 112.

The offset DAC 108 may provide an offset signal to the VCO 112, wherein the offset signal adjusts a characteristic of the signal driving the VCO 112. For example, if the gain DAC 110 provides an analog signal to the VCO 112, the offset DAC 108 may adjust the voltage of the analog signal by an offset amount. The offset DAC 108 may therefore provide small adjustments to the voltage used to control the VCO 112, so that the frequency of the output of the VCO 112 may be adjusted with a level of refinement that might not be possible using the charge pump 104 or gain DAC 110.

The VCO 112 provides an output signal to the output 101*b* and/or divider 114. The frequency of the output signal may depend on the input voltage provided to the VCO 112. For example, a high voltage may correspond to a high or low frequency, and a low voltage may correspond to the opposite (e.g., a low or high frequency, respectively). The VCO 112 may also adjust other characteristics of the output signal, including phase, gain and/or attenuation, and so forth. The VCO 112 may provide an alternating current (AC) output signal, and the output signal may be of any AC shape, including sinewaves, triangle waves, rectangular waves, and so forth (collectively, "AC waveforms").

The output 101*b* is configured to provide the output signal to other devices or circuit components, such as antennas. The output 101*b* provides a connection by which the output signal is made available, in general.

The divider 114 may receive the output signal and divide (or multiply) the frequency of the output signal by a given coefficient. The divider 114 may operate as a frequency divider. In some examples, the divider 114 may adjust the frequency of the output signal to be within a range more closely matched to the frequency of the input signal at the input 101*a* and/or adjust the frequency of the output signal to be within a range better suited for use by the detector 102. The divider 114 may provide an adjusted output signal to an input of the detector 102.

The controller 116 controls at least the operation of the offset DAC 108 or the gain DAC 110. The controller 116 may be any kind of control logic, including a microcontroller, dedicated circuit, and so forth. The controller 116 may receive signals indicative of the state of the PLL 100. For example, the detector 102 may provide information to the controller 116 indicative of the phase and/or frequency difference between the output signal of the VCO 112 and the desired phase and/or frequency. The controller 116 may adjust the gain DAC 110 and/or offset DAC 108 to bring the output signal into line with the desired frequency and/or phase, and may also be configured to adjust other characteristics of the output signal. In some examples, the controller 116 may adjust the gain DAC 110 and/or offset DAC 108 during calibration when the PLL 100 is in an open loop state. When the PLL 100 is in a closed loop state, the controller 116 may not adjust the gain DAC 110 and/or offset DAC 108.

In some examples, the controller 116 may be configured to operate the PLL 100 in one or more modes of operation. The modes of operation may include a first mode of operation, where the controller 116 controls the gain DAC 110 to adjust the output signal of the VCO 112, and a second mode of operation, where the controller 116 controls the offset DAC 108 to adjust the output signal of the VCO 112. In the first mode, the controller 116 controls the gain DAC 110 to directly set the voltage provided to the VCO 112, thus directly controlling the frequency of the output signal of the VCO 112. In the second mode, the controller 116 may adjust the offset voltage of the VCO 112 using the offset DAC 108. The controller 116 may compare the frequency of the output signal to the desired frequency and/or the voltage provided to the VCO 112 and/or to the offset voltage provided to the VCO 112, and may build a table or other form of database of the relationship between input voltage and/or offset voltage and the output frequency of the output signal.

Once the desired frequency and/or calibration process is complete, the controller 116 may lock the PLL 100 (for example, by switching the PLL to a closed loop state). If the output signal deviates by a threshold amount from the desired frequency at a given voltage, the controller 116 may switch the PLL 100 to an open loop state and recalibrate the PLL 100.

Figure 2:
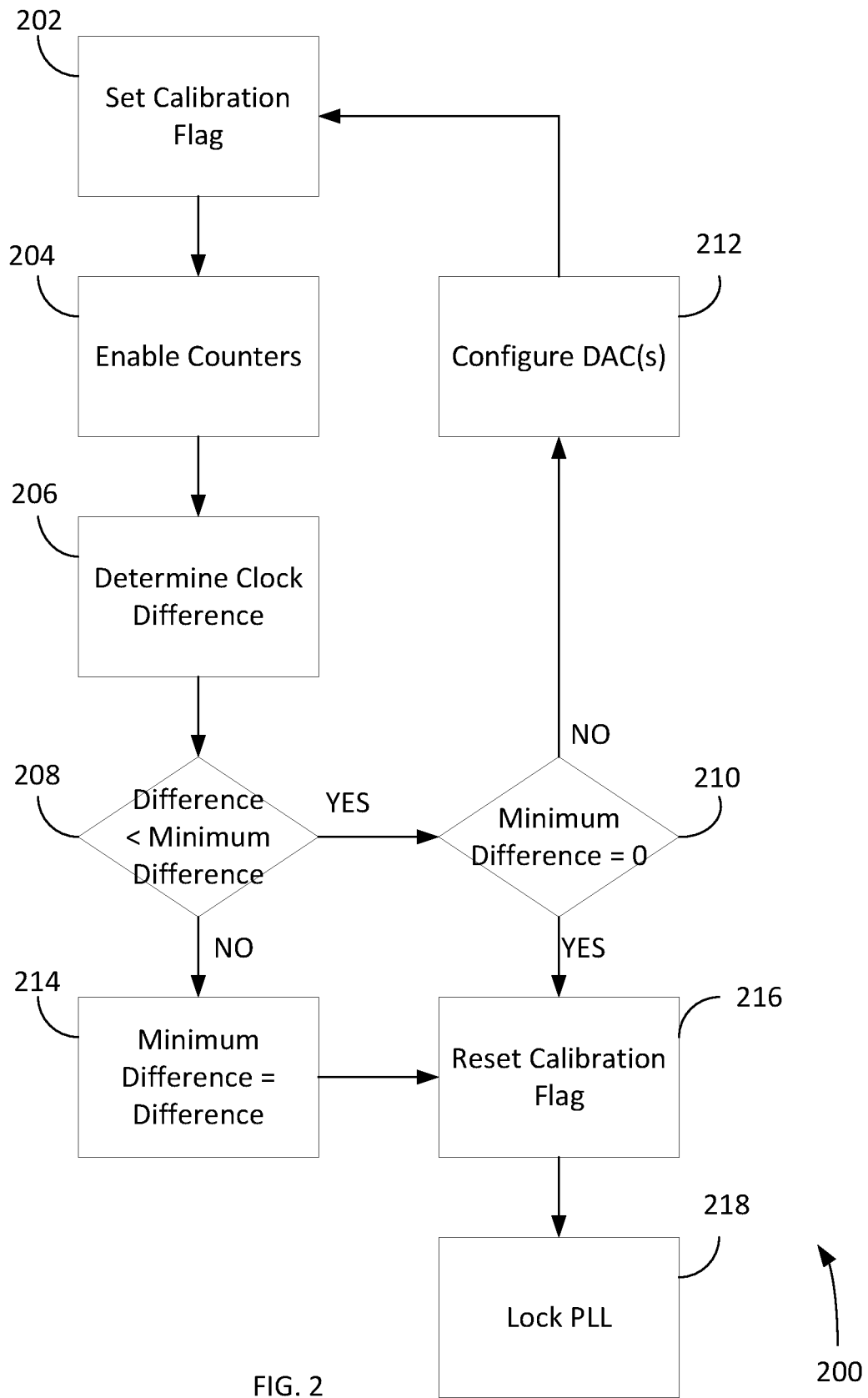
FIG. 2 illustrates a process for calibrating a PLL according to an example.

FIG. 2 illustrate a process 200 for calibrating the PLL 100 according to an example. In process 200, the controller 116 may adjust the voltage provided to the input of the VCO 112 until the VCO 112 reaches a desired frequency. In some examples, the controller 116 uses two counters to compare the frequency of the output signal of the VCO 112 to a desired frequency and/or voltage. The controller 116 then uses the difference between the values contained in the two counters to determine if the difference (and therefore the frequency) between the output signal and the desired signal is within a minimum threshold level. If the frequency of the output signal is within the minimum threshold level, the controller 116 can stop the calibration process or continue the process until the difference is zero. In this way, the controller 116 and/or the PLL 100 can recursively settle on the voltage (at the input of the VCO 112) that produces the output signal with the desired frequency.

At act 202, the controller 116 sets the calibration flag to begin process 200. The controller 116 may set the calibration flag for many reasons, including because the PLL 100 becomes unlocked, or because the PLL 100 is activated for the first time, and/or because the PLL 100 is being used for the first time in a long time, and/or for other reasons (e.g., another device or user has instructed the controller 116 to calibrate the PLL 100). The calibration flag may indicate to a controller or other device that the PLL 100 is in the process of calibrating. Once the calibration flag is set, the process 200 continues to act 204.

At act 204, the controller 116 enables one or more counters and each counter counts for one or more reference cycles. A reference cycle is a period of time long enough to allow the counters to acquire values reflecting the frequencies of the desired signals (e.g., the output signal or the input signal, and so forth). One of the counters may be a feedback counter, and one of the counters may be a reference counter. The reference counter may increment based on a desired frequency or rate of incrementation, or may be driven by a signal, for example, a signal other than the output signal. The feedback counter may increment based on the output signal from the VCO 112. For example, the feedback counter may increment based on zero crossings, maxima, minima, rising edges, and/or falling edges of the output signal. In some examples, the feedback counter may be driven by the output signal of the VCO 112, such that the feedback counter increments at the frequency of the output signal. In some examples, the output signal of the VCO 112 may be divided by the divider 114 and then compared to a reference clock signal instead, and the resulting comparison and/or divided signal may be used to drive the feedback counter. In some examples, dividing the VCO 112 output using the divider 114 may reduce the signal frequency of the output signal of the VCO 112 to a low enough rate that the output signal may be compared to a lower or lowest frequency reference clock rate (provided by a lower frequency or lowest frequency clock). In some examples, comparing the output signal to the lower frequency or lowest frequency reference clock rate means that the lower or lowest frequency reference clock is active while higher frequency clocks are not in use. Be using only the lower or lowest frequency clock and deactivating the other clocks, the system and/or method may save power. Once the counters have counted for the desired number of reference cycles, the process 200 may continue to act 206.

At act 206, the controller 116 determines the clock difference. The clock difference may be determined as the difference between the reference and feedback counter values (e.g., the feedback counter value minus the reference counter value, or the reference counter value minus the feedback counter value, and so forth). Once the controller 116 determines the clock difference, the process 200 may continue to act 208.

At act 208, the controller 116 determines whether the clock difference is less than a minimum clock difference. If the controller 116 determines that the clock difference is less than the minimum clock difference, the process 200 may continue to act 210. If the controller 116 determine that the clock difference is not less than the minimum clock difference, the process 200 may continue to act 214.

At act 210, the controller 116 determines whether the minimum clock difference equals zero. If the controller 116 determines that the minimum clock difference equals zero, the process 200 may continue to act 216. If the controller 116 determines that the minimum clock difference does not equal zero, the process 200 may continue to act 212.

At act 212, the controller 116 configures one or more of the DACs. For example, if the controller 116 is operating the PLL 100 in the first mode of operation (e.g., directly adjusting the output of the gain DAC 110), the controller 116 may reconfigure the level of gain and/or attenuation provided by the gain DAC 110. If the controller 116 is operating the PLL 100 in the second mode of operation (e.g., applying an offset voltage using the offset DAC 108), the controller 116 may reconfigure the level of the offset voltage provided by the offset DAC 108. Once the DACs are reconfigured, the process 200 may proceed to act 202.

At act 214, the controller 116 sets the minimum clock difference to be equal to the clock difference. For example, if the clock difference (e.g., the reference counter value minus the feedback counter value) was less than the minimum clock difference (e.g., 16 ms vs 20 ms) the controller 116 may now set the minimum clock difference to be equal to the clock difference (e.g., set the minimum clock difference to equal 16 ms). The process 200 may then continue to act 216.

At act 216, the controller 116 resets the calibration flag. For example, if the calibration flag was set, the controller 116 may now unset the calibration flag. Unsetting the calibration flag may indicate that the calibration process is complete or that the calibration process is paused or otherwise not presently active. The process 200 may then continue to act 218.

At act 218, the controller 116 may lock the PLL 100 at the current voltage. That is, since the frequency and/or phase of the output signal is controlled by the voltage provided at the input of the VCO 112, the controller 116 may lock the voltage provided at the input of the VCO 112 so that the voltage does not shift in an undesired direction. The controller 116 may then repeat process 200.

In some examples, the controller 116 may repeat process 200 until the minimum difference equals zero. In such examples, when the minimum difference equals zero, the controller 116 may consider calibration complete, and may switch to monitoring the frequency of the output signal and/or the value of the voltage provided to the input of the VCO 112 to ensure that the frequency of the output signal remains within a threshold range of a desired frequency, as will be described with respect to FIG. 3.

Figure 3:
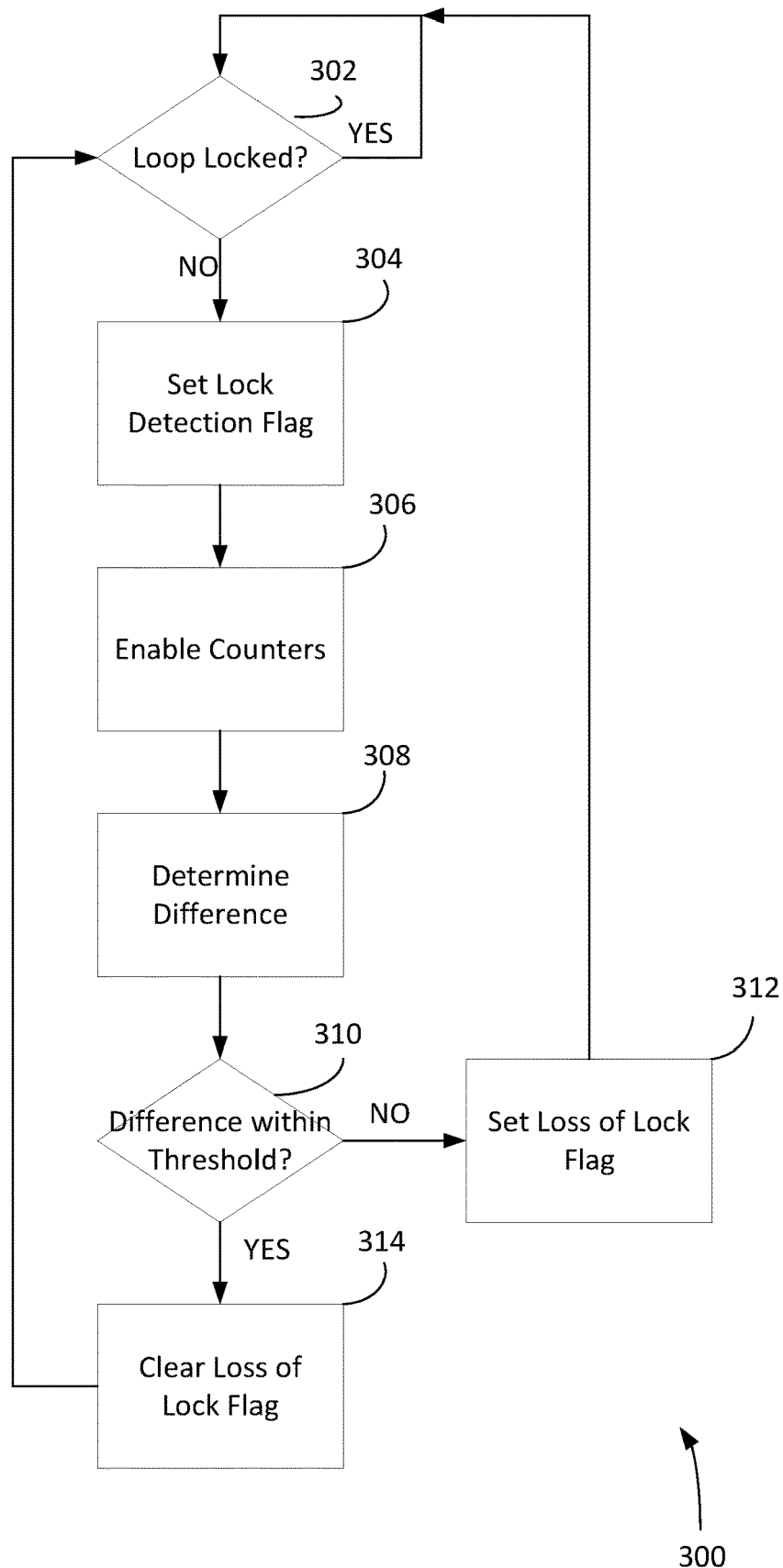
FIG. 3 illustrates a process for calibrating a PLL according to an example.

FIG. 3 illustrates a process 300 for determining if the PLL 100 should be recalibrated according to an example. In some examples, the process 300 detects the loss of lock for the PLL 100. When the PLL 100 becomes "unlocked," this may indicate that the VCO 112 no longer provides an output signal at a desired frequency and/or within a threshold range of the desired frequency. Loss of lock may therefore indicate that conditions have changed (e.g., the temperature, process, or a voltage) has changed, therefore indicating that the controller 116 may need to recalibrate the VCO 112 and/or PLL 100.

At act 302, the controller 116 determines whether the loop is locked. The loop being locked may mean that the voltage provided at the input to the VCO 112 is being held constant or approximately constant, or otherwise not being voluntarily allowed to change, and/or that the frequency of the output signal from the VCO 112 is constant or within a threshold range of a desired frequency. If the controller 116 determines the loop is not locked, the process 300 may continue to act 304. If the controller determines the loop is locked, the process 300 may return or remain at act 302 until lock is detected.

If the loop is not locked, this may indicate that the PLL 100 has not been calibrated, and that the controller 116 is still calibrating the PLL 100 (e.g., still executed process 200 of FIG. 2). In some examples, the controller 116 may not allow the PLL 100 to become locked unless calibration is complete. In some examples, checking for the loop to be locked (e.g., act 302) occurs during closed loop operation of the PLL 100.

At act 304, the controller 116 sets the lock detection flag. The lock detection flag may indicate that a lock was detected at or during act 302. The process 300 may then continue to act 306.

At act 306, the controller may enable one or more counters to count for one or more reference cycles. The enabled counters may include a reference counter and/or a feedback counter. The reference counter may increment based on a desired frequency and the feedback counter may increment based on a frequency of the output signal provided by the VCO 112. Once the reference cycles have elapsed, the process 300 may continue to act 308.

At act 308, the controller 116 may determine the clock difference between the reference counter and the feedback counter. The clock difference may be determined to be the difference between the reference counter value and the feedback counter value. The process 300 may then continue to act 310.

At act 310, the controller 116 determines whether the clock difference is within a threshold amount of a desired value. For example, the clock difference may be within +/−1, 5, 10, or any other amount of the desired value. The desired value may be zero, or may be a value set by the user or another device. If the controller 116 determines that the difference is within the threshold amount of the desired value, the process 300 may continue to act 314. If the controller 116 determines that the difference is not within the threshold amount of the desired value, the process 300 may continue to act 312.

At act 312, the controller 116 sets the loss of lock flag. The loss of lock flag may indicate that the frequency of the output signal of the VCO 112 has deviated by an unacceptable amount from the desired frequency. In some examples, the loss of lock flag may indicate that the voltage provided at the input of the VCO 112 is no longer providing the desired frequency of output signal. In some examples, the controller 116 may execute process 200 of FIG. 2 following a loss of lock. The loss of lock flag may be set responsive to the controller 116 determining that the clock difference is not within the threshold amount of the desired value. The process 300 may then return to act 302.

At act 314, the controller 116 may clear the loss of lock flag (if the flag was set, e.g., at act 312). By clearing the loss of lock flag, the controller 116 may be indicating that the voltage provided at the input of the VCO 112 is still producing an output signal at the output of the VCO 112 that has the desired frequency. The process 300 may then return to act 302.

In some examples, process 200 may run when the PLL 100 is unlocked and/or in an open loop state, and process 300 may run when the PLL 100 is locked and/or in a closed loop state. In said examples, when the PLL 100 becomes unlocked and/or enters an open loop state, the PLL 100 automatically begins to be calibrated, and when the PLL 100 is locked, the PLL 100 automatically monitors to ensure the lock is maintained, so that if the lock is lost, the PLL 100 can be recalibrated.

Figure 4:
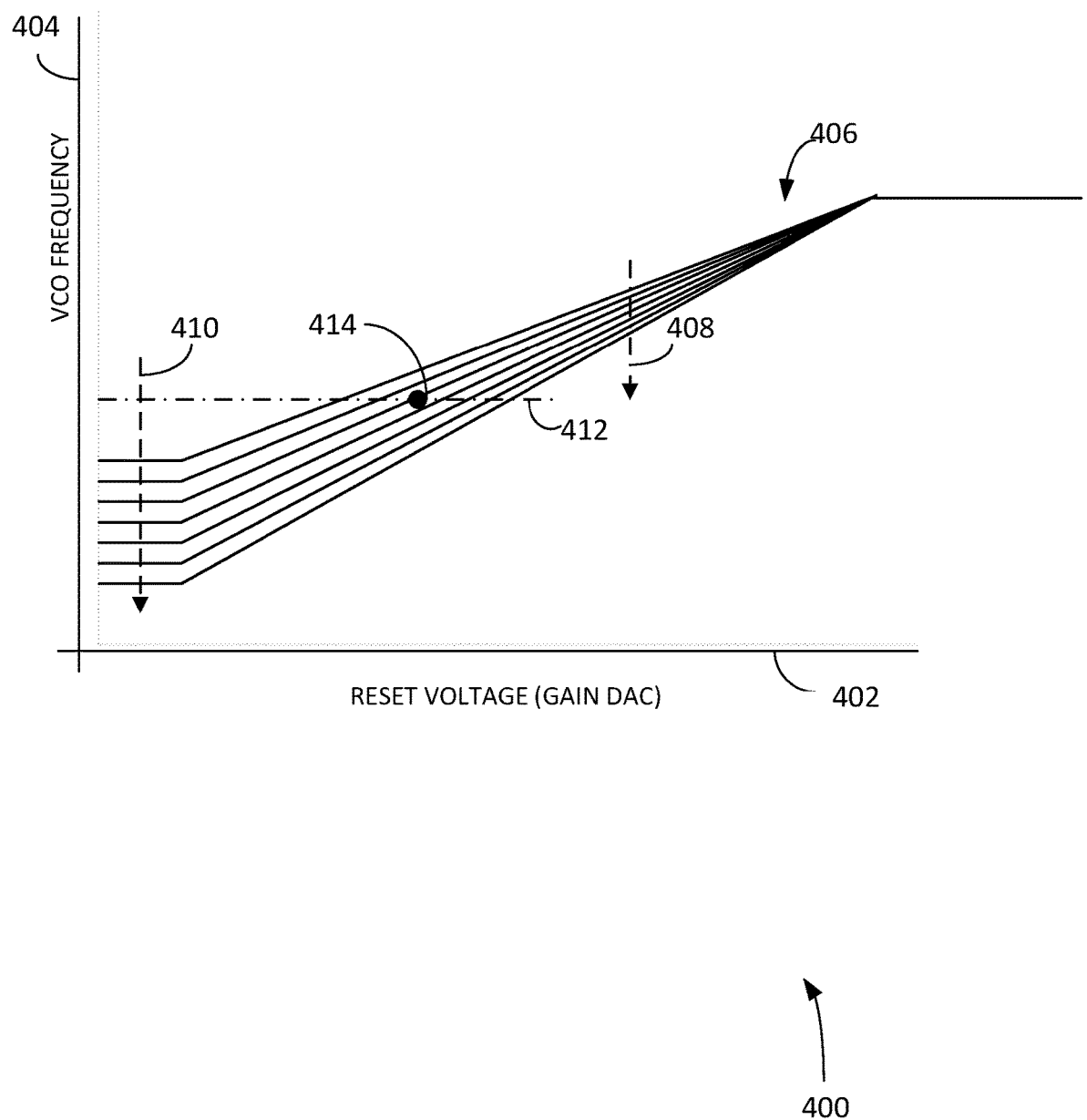
FIG. 4 illustrates a graph for certain characteristics of the operation of a PLL.

FIG. 4 illustrates a graph showing further operations of the PLL 100 according to an example. The graph includes a first axis 402, a second axis 404, a plurality of traces 406, a first arrow 308, second arrow 410, frequency trace 412, and optimal point 414.

The first axis 402 represents the reset voltage of the gain DAC 110 in volts. The second axis 404 represents the frequency of the VCO 112 in hertz. The plurality of traces 406 map the frequency of the VCO 112 against the voltage provided by the gain DAC 110. The first arrow 408 shows the effect and direction of decreasing gain, improved phase noise levels, and/or improved jitter performance. The second arrow 410 shows the effect and direction of decreasing offset DAC 108 voltage. The frequency trace 412 shows the desired VCO 112 frequency (e.g., the desired frequency of the output signal of the VCO 112). The optimal point 414 corresponds to a setting (e.g., a setting of the gain DAC 110 voltage and/or offset DAC 108 voltage) that causes the VCO 112 to operate at the desired frequency while also keeping the settings in a range near the center of the range of the VCO 112 to account for PVT variations.

Each trace of the plurality of traces 406 may represent a curve of the VCO 112 output signal frequency as the voltage provided by the gain DAC 110 changes. Individual traces of the plurality of traces 406 may correspond to voltages provided by the offset DAC 108 to increase or decrease the voltage provided by the gain DAC 110. The optimal point 414 is selected based on the range of possible curves (represented by the plurality of traces 406) such that the performance is better (which generally corresponds to traces of the plurality of traces 406 that are lower, on average, with respect to frequency of the VCO 112) while also providing some room for adjustment due to PVT variations. For example, the frequency trace 412 intersects with numerous traces of the plurality of traces 406. Any of the intersections could produce a VCO 112 output with the desired frequency. However, variations due to process, voltage, or temperature (PVT) could cause the VCO 112 output to shift left, right, up, and/or down while the gain DAC 110 voltage remains constant or approximately constant. Thus, by configuring the settings such that the optimal point 414 is located near the middle of the traces of the plurality of traces 406, variations, such as PVT variations, may be reduced or mitigated by keeping the VCO 112 output at or near the desired frequency.

Various controllers, such as the controller 116, may execute various operations discussed above. Using data stored in associated memory and/or storage, the controller 116 also executes one or more instructions stored on one or more non-transitory computer-readable media, which the controller 116 may include and/or be coupled to, that may result in manipulated data. In some examples, the controller 116 may include one or more processors or other types of controllers. In one example, the controller 116 is or includes at least one processor. In another example, the controller 116 performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

Having thus described several aspects of at least one embodiment, it is to be appreciated various alterations, modifications, and improvements will readily occur to those skilled in the art. Such alterations, modifications, and improvements are intended to be part of, and within the spirit and scope of, this disclosure. Accordingly, the foregoing description and drawings are by way of example only.

What is claimed is:

1. A system for automatically calibrating a phase locked loop (PLL), the system comprising:
   a node;
   a voltage-controlled oscillator (VCO) coupled to the node and configured to provide an output signal to the node;
   at least one digital-to-analog converter (DAC) coupled to the VCO and configured to provide a voltage to the VCO; and
   at least one controller configured to:
      identify an output frequency of the output signal;
      compare the output frequency to a target frequency; and control the at least one DAC to modify the voltage based on the comparison of the output frequency to the target frequency.

2. The system of claim 1, further comprising:
a feedback counter configured to determine the output frequency of the output signal.

3. The system of claim 1, further comprising:
a reference counter configured to increment at a rate based on the target frequency.

4. The system of claim 1, wherein;
the node is an output node; and
the system further comprises an input node configured to receive an input signal.

5. The system of claim 4, further comprising:
a phase-frequency detector coupled to the input node and the output node and configured to detect at least one of a phase difference between the input signal and the output signal or a frequency difference between the input signal and the output signal.

6. The system of claim 5, further comprising:
a charge pump coupled to the phase-frequency detector;
a filter coupled to the charge pump; and
a divide-by-N counter coupled between the phase-frequency detector and the output node.

7. The system of claim 1, wherein the at least one DAC is configured to control a gain and an attenuation of the voltage based on the output signal and an input signal.

8. The system of claim 1, wherein the at least one DAC is configured to control an offset voltage applied to the voltage, the offset voltage either increasing or decreasing the voltage based on the output signal and an input signal.

9. A method of automatically calibrating a phase locked loop (PLL), the method comprising:
providing an output signal from an output of a voltage-controlled oscillator (VCO);
determining a first counter value based on an output frequency of the output signal;
determining a second counter value based on a target frequency;
determining a clock difference between the first counter value and the second counter value; and
changing the output frequency of the output signal based on the clock difference.

10. The method of claim 9, wherein changing the output frequency of the output signal based on the clock difference includes changing a gain or an attenuation of a voltage provided to an input of the VCO to control the output frequency of the output signal.

11. The method of claim 9, wherein changing the output frequency of the output signal based on the clock difference includes applying an offset voltage to a voltage provided to an input of the VCO to control the output frequency of the output signal.

12. The method of claim 9, wherein changing the output frequency of the output signal based on the clock difference includes changing a voltage provided to an input of the VCO responsive to the clock difference being non-zero.

13. The method of claim 9, wherein the target frequency is a frequency of an input signal provided to an input node of the PLL.

14. A non-transitory computer-readable medium containing thereon instructions for calibrating a phase locked loop (PLL), the instructions when executed causing at least one processor to:
determine a first counter value corresponding to an output frequency of an output signal of a voltage-controlled oscillator (VCO);
determine a second counter value corresponding to a reference frequency of a reference signal;
determine a difference between the first counter value and the second counter value; and
responsive to determining that the difference is non-zero, alter a voltage provided to an input of the VCO to change the output frequency of the output signal.

15. The non-transitory computer-readable medium of claim 14, wherein the instructions when executed further cause the at least one processor to:
determine whether the difference is zero; and
responsive to determining that the difference is zero, lock the voltage provided to the input of the VCO.

16. The non-transitory computer-readable medium of claim 15, wherein the instructions when executed further cause the at least one processor to:
responsive to locking the voltage, determine whether the difference exceeds zero by a threshold value; and
responsive to determining that the difference exceeds zero by the threshold value, unlock the voltage provided to the input of the VCO.

17. The non-transitory computer-readable medium of claim 14, wherein the instructions when executed further cause the at least one processor to:
control an offset digital-to-analog converter (DAC) to provide an offset voltage to change the voltage provided to the input of the VCO based on the difference.

18. The non-transitory computer-readable medium of claim 14, wherein the instructions when executed further cause the at least one processor to:
control a gain digital-to-analog converter (DAC) to change the voltage provided to the input of the VCO based on the difference.

19. The non-transitory computer-readable medium of claim 14, wherein the instructions when executed further cause the at least one processor to:
responsive to determining the difference, determine whether the difference is less than a minimum difference; and
responsive to determining that the difference is less than the minimum difference and greater than zero, continue calibrating the PLL.

20. The non-transitory computer-readable medium of claim 19, wherein the instructions when executed further cause the at least one processor to:
responsive to continuing to calibrate the PLL, change the minimum difference to equal the difference.

* * * * *